US009536466B2

(12) United States Patent
Nie et al.

(10) Patent No.: US 9,536,466 B2
(45) Date of Patent: Jan. 3, 2017

(54) SHIFT REGISTER UNIT, GATE DRIVING CIRCUIT AND DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Leisen Nie, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 127 days.

(21) Appl. No.: 14/526,432

(22) Filed: Oct. 28, 2014

(65) Prior Publication Data
US 2015/0364079 A1 Dec. 17, 2015

(30) Foreign Application Priority Data
Jun. 16, 2014 (CN) .......................... 2014 1 0267456

(51) Int. Cl.
G11C 19/00 (2006.01)
G09G 3/20 (2006.01)
G11C 19/28 (2006.01)

(52) U.S. Cl.
CPC ............. *G09G 3/2096* (2013.01); *G11C 19/28* (2013.01); *G09G 2310/0286* (2013.01)

(58) Field of Classification Search
None
See application file for complete search history.

(56) References Cited

U.S. PATENT DOCUMENTS 4,623,908 A * 11/1986 Oshima ................. G02F 1/1368
257/66
6,426,743 B1 * 7/2002 Yeo ....................... G09G 3/3677
345/100

(Continued)

FOREIGN PATENT DOCUMENTS

| CN | 102819998 | 12/2012 |
|---|---|---|
| CN | 103226927 | 7/2013 |
| CN | 203882580 | 10/2014 |

OTHER PUBLICATIONS

Chinese Office Action with English Language Translation, dated Dec. 31, 2015, Chinese Application No. 201410267456.4.

(Continued)

*Primary Examiner* — Tuan T Lam
(74) *Attorney, Agent, or Firm* — Blakely Sokoloff Taylor & Zafman LLP

(57) ABSTRACT

This disclosure provides a shift register unit comprising an access control module and a shift register module. The access control module is used for controlling access of an input signal and a reset signal. The shift register module is used for outputting the accessed input signal or reset signal under the driving of a clock signal. The access control module comprises a depletion field effect transistor. The shift register unit further comprises a connection control module arranged between the access control module and the shift register module for blocking the connection between the access control module and the shift register module when the shift register module performs outputting. By means of the design of the connection control module in this disclosure, when the shift register unit performs outputting, its high potential leakage path is blocked, so as to reduce the leakage current greatly, and ensure normal output of the shift register unit. This disclosure further provides a gate driving (Continued)

circuit comprising the shift register unit and a display panel comprising the gate driving circuit.

18 Claims, 5 Drawing Sheets

(56) References Cited

U.S. PATENT DOCUMENTS

| | | | | |
|---|---|---|---|---|
| 7,612,754 | B2* | 11/2009 | Kuo | G09G 3/3677 345/100 |
| 7,978,809 | B2* | 7/2011 | Lai | G11C 19/28 377/64 |
| 8,330,702 | B2* | 12/2012 | Miyake | G09G 3/3677 345/100 |
| 8,605,027 | B2* | 12/2013 | Pak | G09G 3/3677 315/169.2 |
| 8,867,697 | B2* | 10/2014 | Jang | G09G 3/3677 377/64 |
| 9,269,289 | B2* | 2/2016 | Gao | G11C 19/28 |
| 2008/0012818 | A1* | 1/2008 | Lee | G09G 3/3677 345/100 |
| 2011/0080385 | A1* | 4/2011 | Kitagishi | G09G 3/3677 345/204 |
| 2011/0116592 | A1* | 5/2011 | Tsai | G11C 19/184 377/79 |
| 2011/0274234 | A1* | 11/2011 | Sakamoto | G11C 19/184 377/64 |
| 2012/0139599 | A1* | 6/2012 | Chen | G09G 3/3677 327/203 |
| 2014/0023173 | A1* | 1/2014 | Miyake | G11C 19/188 377/54 |
| 2014/0064439 | A1* | 3/2014 | Qing | G11C 19/28 377/75 |
| 2014/0093028 | A1* | 4/2014 | Wu | G11C 19/28 377/64 |
| 2015/0043703 | A1* | 2/2015 | Tan | G11C 19/28 377/68 |
| 2015/0302934 | A1* | 10/2015 | Qi | G11C 19/28 377/54 |

OTHER PUBLICATIONS

Chinese Office Action with English Language Translation dated Apr. 13, 2016, Chinese Application No. 201410267456.4, 4 pages.

* cited by examiner

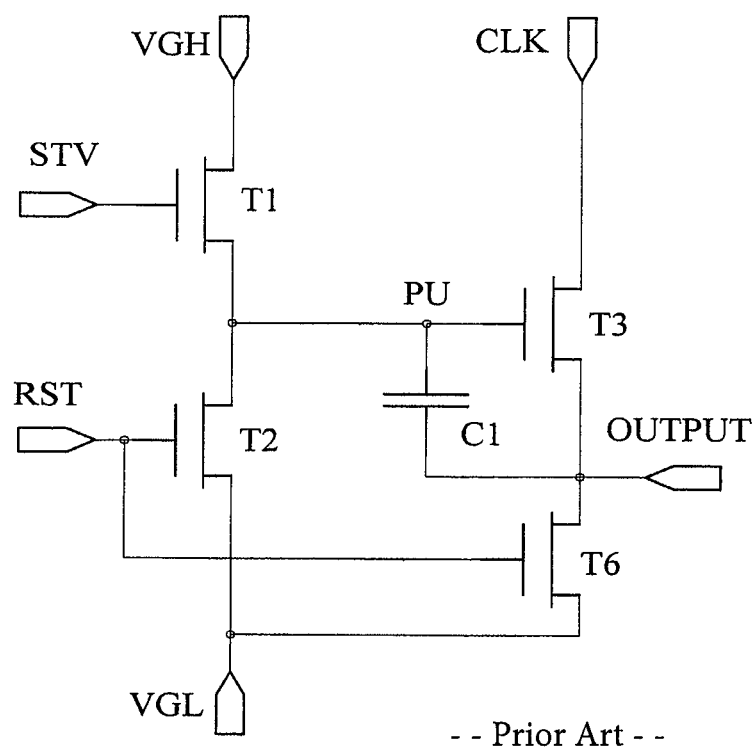
Fig. 3   - - Prior Art - -
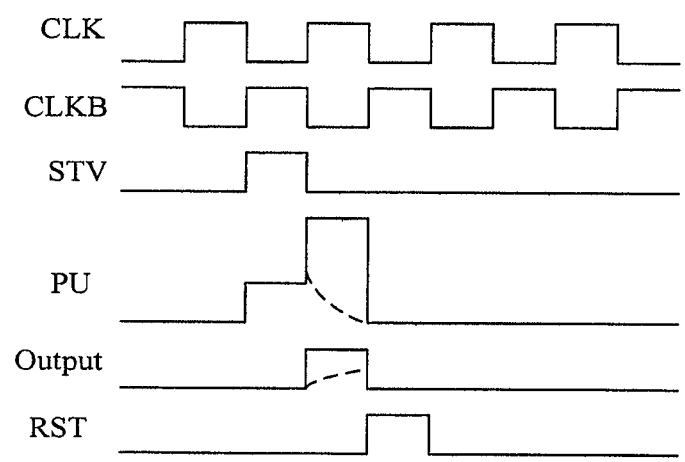
Fig. 4   - - Prior Art - -

SHIFT REGISTER UNIT, GATE DRIVING CIRCUIT AND DISPLAY PANEL

RELATED APPLICATIONS

The present application claims the benefit of Chinese Patent Application No. 201410267456.4, filed Jun. 16, 2014, the entire disclosure of which is incorporated herein by reference.

FIELD OF THE INVENTION

This disclosure relates to the display field, specifically to a shift register unit, a gate driving circuit and a display panel.

BACKGROUND OF THE INVENTION

With the development of the panel display, a-Si and p-Si technologies are usually applied in shift register circuits, and the shift register circuits using these technologies serve as the basic units to form a gate driving circuit of a narrow frame display panel with a high resolution. The oxide thin film transistor (TFT), as a very promising semiconductor technology, is simpler than the p-Si process, has a lower cost, and has a higher mobility than the a-Si, therefore, it has more wide application prospects.

However, the oxide TFT is a depletion transistor, while the a-Si and p-Si mentioned above are both enhancement transistors, the gate source voltage-source current characteristics of the two are as shown in FIG. 1 (enhancement type) and FIG. 2 (depletion type) respectively, the vertical axis thereof is the source current, the horizontal axis thereof is the gate source voltage. From FIG. 1 it can be seen that the source current $i_D$ is zero when the gate source voltage $v_{GS}$ is zero, which shows that the enhancement transistor is completely turned off when $v_{GS}$ is 0V. However, as for the depletion transistor in FIG. 2, $i_D$ is far greater than zero when $v_{GS}$ is 0V; and $i_D$ is zero only when $v_{GS}$ is −6V. That is to say, the depletion transistor is still in the turn-on state when $v_{GS}$ is 0V and cannot be turned off. Therefore, when the shift register circuit that can work normally using a-Si or p-Si in the prior art is fabricated using the depletion transistors, since it cannot be turned off normally, the leakage current is relatively large, the circuit cannot work normally.

Specifically, refer to the conventional shift register unit circuit as shown in FIG. 3. When the circuit is fabricated using enhancement transistors, the circuit can work normally, just as shown in the solid line parts in the work timing diagram of the circuit in FIG. 4. However, if the circuit is fabricated using depletion transistors, since the leakage current is too large, such that the potential of the PU point in the figure cannot be held, and the circuit cannot output normally, the circuit fails, as shown in the dotted line parts in FIG. 4.

SUMMARY OF THE INVENTION

This disclosure provides a shift register unit, by means of the design of a connection control module, when the shift register unit performs outputting, its high potential leakage path is blocked, so as to reduce the leakage current greatly, and ensure normal output of the shift register unit. This disclosure further provides a gate driving circuit comprising the shift register unit and a display panel comprising the gate driving circuit.

According to an exemplary embodiment, the shift register unit comprises an access control module and a shift register module. The access control module is used for controlling access of an input signal and a reset signal, the access control module comprises a depletion field effect transistor. The shift register module is used for outputting the accessed input signal or reset signal under the driving of a clock signal. The shift register unit further comprises: a connection control module arranged between the access control module and the shift register module for blocking the connection between the access control module and the shift register module when the shift register module performs outputting.

According to an exemplary embodiment, the shift register module comprises a first switch element, a second switch element and a first capacitor; a first end of the first switch element is connected with a second end of the second switch element and a second end of the first capacitor, and is connected with an output end of the shift register unit; a control end of the first switch element is connected with a first end of the first capacitor, and is connected with the connection control module; the clock signal comprises a first clock signal and a second clock signal, the first clock signal is connected to a second end of the first switch element, the second clock signal is connected to a control end of the second switch element; a first end of the second switch element is connected with a low level working voltage line.

According to an exemplary embodiment, the shift register module further comprises a third switch element, a fourth switch element, a fifth switch element and a second capacitor; a second end of the third switch element is connected with the output end of the shift register unit; a control end of the third switch element is connected with a second end of the second capacitor, a second end of the fourth switch element, and a control end of the fifth switch element; a second end of the fifth switch element is connected with a control end of the fourth switch element, and is connected with the control end of the first switch element; the first clock signal is further connected to a first end of the second capacitor; first ends of the third, fourth, and fifth switch elements are connected with the low level working voltage line.

According to an exemplary embodiment, the switch elements of the shift register module are all depletion thin film transistors, the first end of the fourth switch element is changed to be connected to a bias voltage line whose voltage value is lower than the low level working voltage.

According to an exemplary embodiment, the connection control module comprises a sixth switch element, a seventh switch element, an eighth switch element and a third capacitor; a second end of the sixth switch element is connected with a first end of the eighth switch element, a first end of the third capacitor; a second end of the seventh switch element is connected with a second end of the third capacitor; a first end of the sixth switch element is connected with the shift register module, a second end of the eighth switch element is connected with the access control module; the clock signal comprises a first clock signal and a second clock signal, the first clock signal is connected to a control end of the seventh switch element, the second clock signal is connected to control ends of the sixth switch element and the eighth switch element; a first end of the seventh switch element is connected with the low level working voltage line.

According to an exemplary embodiment, the access control module comprises a ninth switch element, a tenth switch element, an eleventh switch element and a twelfth switch element; a second end of the ninth switch element is connected with a first end of the tenth switch element, and control ends of the ninth switch element and the tenth switch element are connected with a reset end of the shift register unit; a second end of the tenth switch element is connected with a first end of the eleventh switch element, and is connected with the connection control module; a second end of the eleventh switch element is connected with a first end of the twelfth switch element, and a second end of the twelfth switch element is connected with an input end of the shift register unit; the clock signal comprises a first clock signal and a second clock signal, the second clock signal is connected to control ends of the eleventh switch element and the twelfth switch element; a first end of the ninth switch element is connected with the low level working voltage line.

According to an exemplary embodiment, the switch element is a thin film transistor.

According to an exemplary embodiment, the thin film transistor is an oxide thin film transistor.

According to an exemplary embodiment, a gate driving circuit comprises at least two cascaded shift register units using any one of the above shift register units.

According to an exemplary embodiment, a display panel comprises any one of the above gate driving circuits.

This disclosure arranges a connection control module between the access control module and the shift register module so as to block the connection between the access control module and the shift register module when the shift register module performs outputting. In this way, the leakage path from the high potential point in the shift register module to the low potential point in the access control module is blocked, which can reduce the leakage current that passes through the access control module effectively and ensure normal output of the shift register unit.

Moreover, this disclosure is also applicable for a circuit that uses depletion transistors completely, that is, a shift register unit that is constituted by transistors which are all oxide TFTs can be provided, and the normal function of the shift register unit can also be ensured, which has a very high practical value.

BRIEF DESCRIPTION OF DRAWINGS

In order to explain the technical solutions in the embodiments of the present or in the prior art more clearly, the drawings that need to be used in the depiction of the embodiments or the prior art will be introduced briefly in the following. Apparently, the drawings described below correspond to some exemplary embodiments of the present invention, the ordinary skilled person in the art can also obtain other drawings based on these drawings without paying any creative work.

FIG. 3 is a circuit diagram of a conventional shift register unit of the prior art;

FIG. 4 is a work timing diagram of a conventional shift register unit of the prior art;

DETAILED DESCRIPTION OF THE INVENTION

In order to make the purposes, technical solutions and advantages of respective exemplary embodiments of this disclosure more clear, the technical solutions in the exemplary embodiments of the present invention will be described clearly and completely in combination with the drawings in this disclosure in the following. Apparently, the exemplary embodiments described are only part rather than all of the embodiments of this disclosure. Based on the exemplary embodiments in this disclosure, all the other embodiments obtained by the ordinary skilled person in the art without paying any creative work belong to the scope of this disclosure.

Embodiment 1

Figure 5:
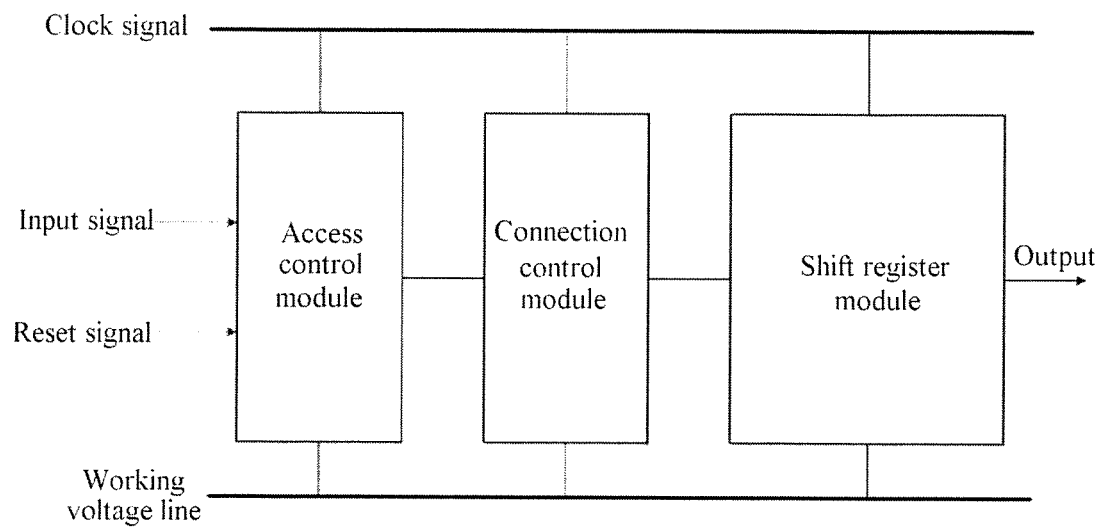
FIG. 5 is a circuit structure block diagram of a shift register unit according to an exemplary embodiment of the present invention.

According to an exemplary embodiment, a shift register unit is proposed. Referring to FIG. 5, the shift register unit comprises an access control module and a shift register module. The access control module is used for controlling access of an input signal and a reset signal, the access control module comprises a depletion field effect transistor. The shift register module is used for outputting the accessed input signal or reset signal under the driving of a clock signal.

The shift register unit further comprises: a connection control module arranged between the access control module and the shift register module for blocking the connection between the access control module and the shift register module when the shift register module performs outputting. Each module needs to be connected to a working voltage line, a fixed working voltage is provided by the working voltage line. Moreover, each module needs to access a clock signal for realizing timing of synchronization trigger of the circuit.

Specifically, since the access control module is used for controlling access of an input signal and a reset signal from the exterior, generally two or two sets of switch elements may be arranged to control connection of the input signal and the reset signal with other modules in the shift register unit. And since the shift register module is used for outputting the accessed input signal or reset signal under the driving of the clock signal, it can perform outputting and resetting based on the access signal according to clock trigger sequence, just as the local circuit consisting of T3, T6 and C1 in FIG. 3. Both of the two modules can be realized in multiple ways in the prior art, what is shown in FIG. 3 is also one of them.

As stated above, the access control module generally adopts a switch element to control access of the signal, so when the switch element is specifically a depletion transistor, the problem of a too large leakage current in the close state may occur. Taking FIG. 3 as an example, the PU points therein are exactly connected with the VGL (low level working voltage) through the source and drain of the depletion transistor T2. When PU is of high level while T2 is in the close state, due to the properties of the depletion transistor, the high potential of the PU point will flow to the low level working voltage line in the form of the leakage current via T2. Thus, the high potential of the PU point cannot be held, the high potential of the gate of T3 also cannot be held, which cannot be turned on and off normally, nor can the shift register unit perform normal output at its output end.

In order to avoid occurrence of such a case, the exemplary embodiment of this disclosure arranges a connection control module between the access control module and the shift register module. By blocking the connection between the access control module and the shift register module when the shift register module performs outputting, the leakage of electricity from the PU point to the low level working voltage line can be blocked, so as to reduce the leakage current that passes through the access control module effectively, and ensure normal output of the shift register unit.

The PU point mentioned here refers to the access position of the shift register module, namely, the output position of the access control module or the connection control module.

In order to explain the technical solutions of respective exemplary embodiments of this disclosure more specifically, the circuit structure of an exemplary shift register unit according to the technical concept of this disclosure will be exhibited below.

Figure 6:
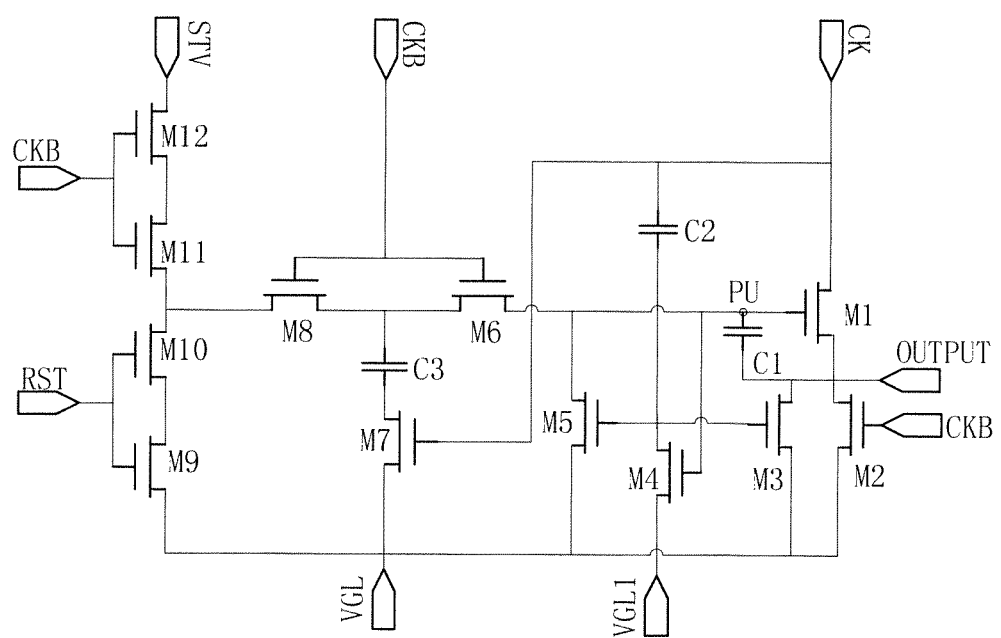
FIG. 6 is a circuit structure diagram of a shift register unit according to an exemplary embodiment of the present invention.

Referring to FIG. 6, the circuit comprises an access control module (M9-M12), a connection control module (M6 to M8, C3) and a shift register module (M1 to M5, C1, C2).

The shift register module comprises a first switch element M1, a second switch element M2 and a first capacitor C1, wherein a first end of the first switch element M1 is connected with a second end of the second switch element M2 and a second end of the first capacitor C1, and is connected with an output end OUTPUT of the shift register unit.

A control end of the first switch element M1 is connected with a first end of the first capacitor C1, and is connected with the connection control module.

The clock signal comprises a first clock signal CK and a second clock signal CKB, the first clock signal CK is connected to a second end of the first switch element M1, the second clock signal CKB is connected to a control end of the second switch element M2.

A first end of the second switch element M2 is connected with a low level working voltage line VGL.

Compared with FIG. 3 it can be seen that this part is similar as the configuration of the shift register unit in the basic shift register unit in FIG. 3.

The shift register module further comprises a third switch element M3, a fourth switch element M4, a fifth switch element M5 and a second capacitor C2.

A second end of the third switch element M3 is connected with the output end OUTPUT of the shift register unit.

A control end of the third switch element M3 is connected with a second end of the second capacitor C2, a second end of the fourth switch element M4, and a control end of the fifth switch element M5.

A second end of the fifth switch element M5 is connected with a control end of the fourth switch element M4, and is connected with the control end of the first switch element M1.

The first clock signal CK is further connected to a first end of the second capacitor C2.

First ends of the third, fourth, and fifth switch elements M3, M4, M5 are connected with the low level working voltage line VGL.

This part belongs to additional units in the shift register module according to the technical concept of this disclosure, which has a better output effect than the shift register unit as shown in FIG. 3.

Figure 1:
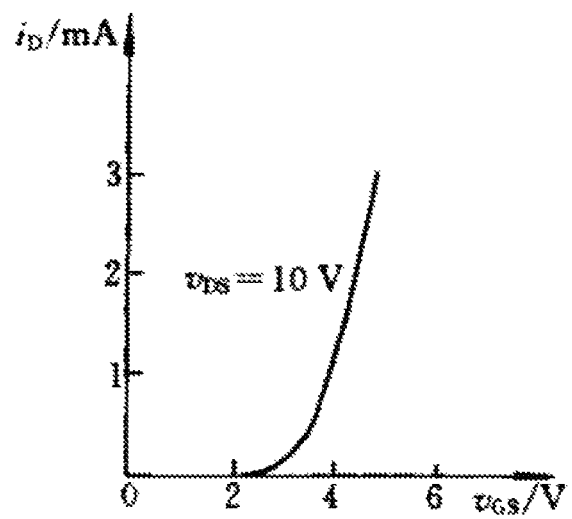
FIG. 1 is a gate source voltage-source current characteristics curve of an enhancement transistor.
Figure 2:
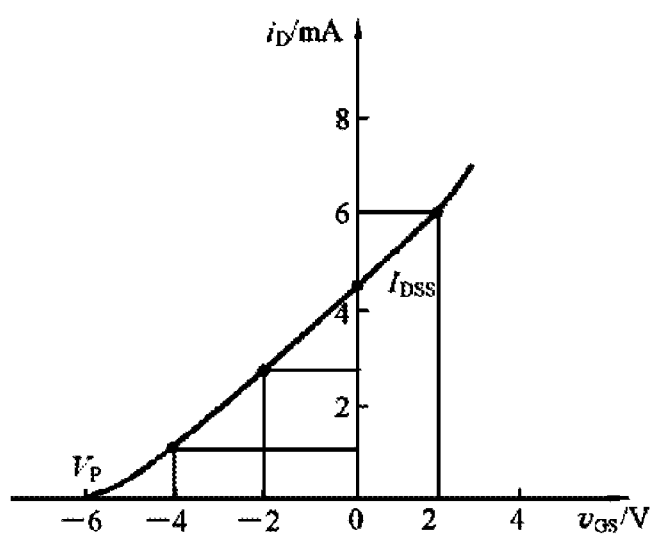
FIG. 2 is a gate source voltage-source current characteristics curve of a depletion transistor.

When the above switch elements are all depletion thin film transistors, such a shift register module may have the problem of leakage of electricity from PU point through M4. Therefore, the first end of the fourth switch element M4 is changed to be connected to a bias voltage line VGL1 whose voltage value is lower than the low level working voltage (in other words, reducing the low level connected by the first end of M4 further, VGL1<VGL), the voltage value thereof is set specifically based on the characteristic curve of the depletion thin film transistor employed as shown in FIG. 2. For example, it may be set specifically here VLG1=−16V (6V lower than the low level working voltage of −10V).

The above is exemplary description of the corresponding circuit configuration of the shift register module in the circuit, next the connection control module in the exemplary embodiments of this disclosure will be introduced specifically.

The connection control module comprises a sixth switch element M6, a seventh switch element M7, an eighth switch element M8 and a third capacitor C3.

A second end of the sixth switch element M6 is connected with a first end of the eighth switch element M8 and a first end of the third capacitor C3.

A second end of the seventh switch element M7 is connected with a second end of the third capacitor C3.

A first end of the sixth switch element M6 is connected with the shift register module, a second end of the eighth switch element M8 is connected with the access control module.

The clock signal comprises a first clock signal CK and a second clock signal CKB. The first clock signal CK is connected to a control end of the seventh switch element M7, the second clock signal CKB is connected to control ends of the sixth switch element M6 and the eighth switch element M8.

A first end of the seventh switch element M7 is connected with the low level working voltage line.

Under the control of the clock signal, i.e. when the CKB is of low level, M6 and M8 are in close state, thereby preventing leakage of electricity of the PU point to the low potential point in the access control module effectively.

Next, the structure of the access control module will be described.

The access control module comprises a ninth switch element M9, a tenth switch element M10, an eleventh switch element M11 and a twelfth switch element M12.

A second end of the ninth switch element M9 is connected with a first end of the tenth switch element M10, and control ends of the ninth switch element M9 and the tenth switch element M10 are connected with a reset end RST of the shift register unit.

A second end of the tenth switch element M10 is connected with a first end of the eleventh switch element M11, and is connected with the connection control module.

A second end of the eleventh switch element M11 is connected with a first end of the twelfth switch element M12, and a second end of the twelfth switch element M12 is connected with an input end STV of the shift register unit.

The clock signal comprises a first clock signal CK and a second clock signal CKB, the second clock signal CKB is connected to control ends of the eleventh switch element M11 and the twelfth switch element M12.

A first end of the ninth switch element M9 is connected with the low level working voltage line.

The respective modules are independent from one another in implementation of their functions, so several modules are separated when describing the clock signal. However, as an integral circuit, the clock signal and the working voltage line are both consistent, just like the modular structure as shown in FIG. 5.

Any of the above switch elements is a thin film transistor. The thin film transistor is specifically an oxide thin film transistor (which belongs to a depletion transistor). The first end of the switch element refers to the drain or source of TFT, the second end of the switch element refers to the source or drain of TFT, and the control end of the switch element refers to the gate of TFT. The exemplary circuit according to the technical concept of this disclosure holds the potential of the PU point by two cascaded transistors M6 and M8. When the CKB is of low level, M6 and M8 are turned off. Due to the effect of the third capacitor C3, $v_{GS}$ of M6 is less than 0 or less than its threshold voltage, such that M6 can be turned off effectively, thereby suppressing the leakage path of the PU point. The input end of the circuit adopts a double-TFT structure which may suppress leakage of the whole circuit between the input end and the output end effectively.

Figure 7:
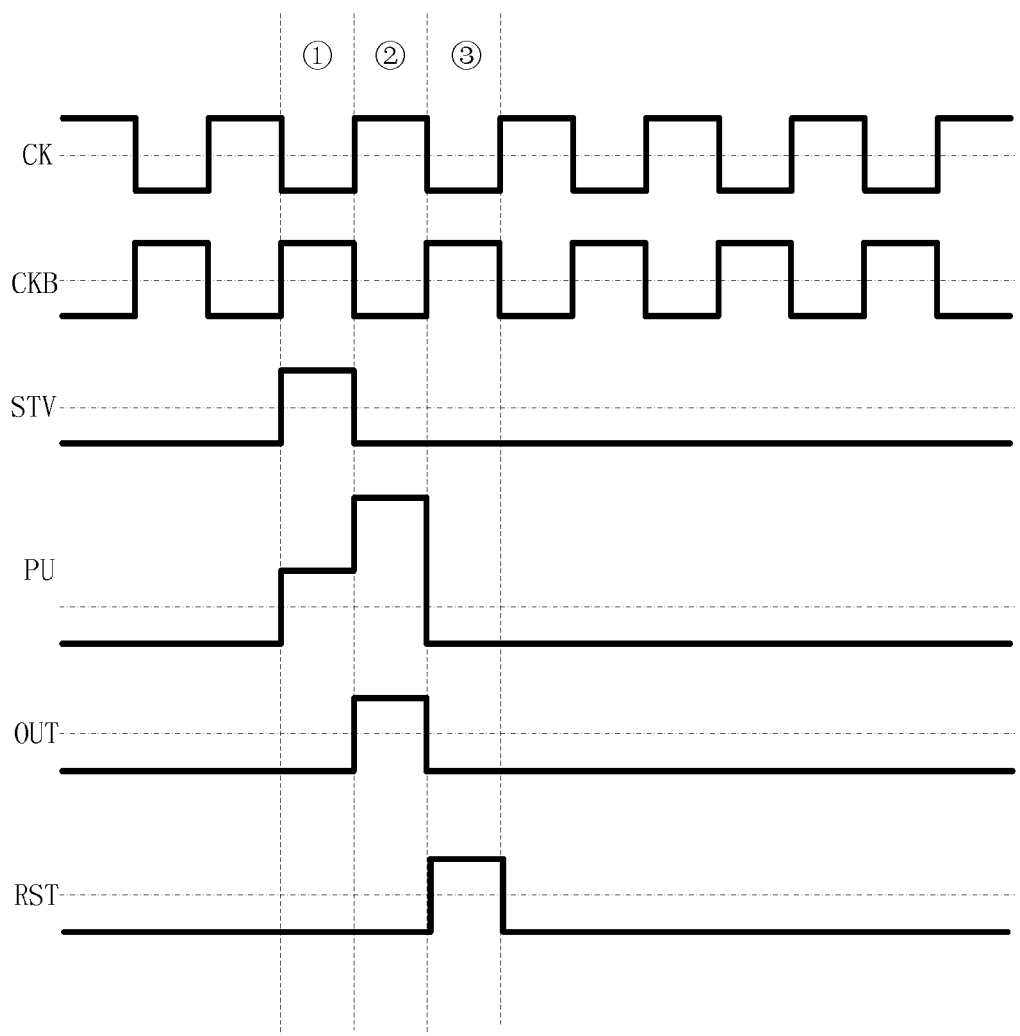
FIG. 7 is a work timing diagram of a shift register unit according to an exemplary embodiment of the present invention.

Referring to FIG. 7 for the work timing diagram of the shift register unit (wherein the dash dot line represents oV potential, and the high potential is +10V, the low potential is −10V), its working process is mainly divided into three phases of ①, ②, ③.

① Phase One: The CK and RST are of low level, the CKB and the STV are of high level. M1 is in the cut-off state, M11, M12, M8, M6 are in the turn-on state. The high level signal at the STV is transferred to the PU point, the capacitors C1, C3 start charging. With the rising of the PU point potential, M4 is turned on gradually, the capacitor C2 also starts charging. The gates of M3 and M5 are applied with VGL1 voltage through M4, thereby turning off M3 and M5 effectively.

② Phase Two: The CK is of high level, the CKB, the STV, and the RST are all of low level. The CKB signal turns off M8 and M6, here M7 is turned on, C3 starts discharging. For M6, its $v_{GS}$<0, which is in the effective cut-off state. Since the PU point is at high potential, M4 is in the turn-on state, M3, M5 are in the cut-off state effectively. Thus, the PU point has no leakage, and is pulled to a higher potential at the same time. Here M1 is in the turn-on state, the output OUTPUT is of high level.

③ Phase Three: The CK is of low level, the RST and the CKB are of high level. M2, M6, M8, M9, M10, M11, M12 are in the turn-on state. The potential at the OUTPUT is pulled down through M2, the potential at the PU point is released through M6, M8, M9, M10. Meanwhile, C2 starts discharging, M3 and M5 are turned on and can also release the high potential at the PU point.

Figure 8:
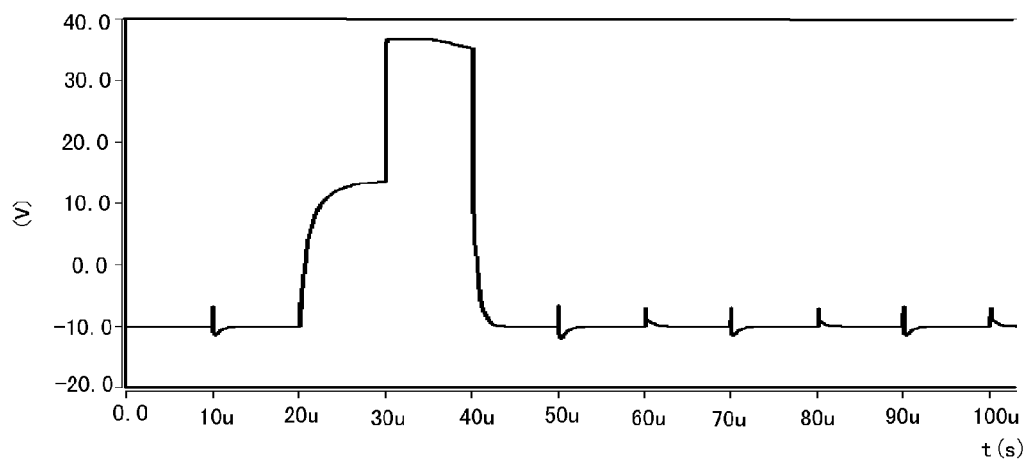
FIG. 8 is a simulated diagram of PU point potentials of a shift register unit according to an exemplary embodiment of the present invention under high temperature.

As shown in FIG. 4, when the shift register unit applies the oxide TFT into the access control module, its leakage phenomenon is very serious. Particularly in the case of high temperature, it makes the PU point failing to hold the high potential, the gate output abnormal, and cannot ensure normal work of the shift register unit. And referring to FIG. 8 for simulation of the PU point potential of an exemplary shift register unit according to the technical concept of this disclosure under high temperature, compared with FIG. 7 it can be seen that the ideal potential change trend of the PU point is substantially the same as the actual change trend. It can be seen that the PU point potential can be held perfectly in gate output after the technical solution according to the technical concept of this disclosure is applied.

To sum up, by arranging a connection control module between the access control module and the shift register module, the technical solution according to the technical concept of this disclosure blocks the connection between the access control module and the shift register module when the shift register module performs outputting. Thus, the leakage path from the high potential point in the shift register module to the low potential point in the access control module is blocked, which can reduce the leakage current that passes through the access control module effectively, and ensure normal output of the shift register unit.

Moreover, this disclosure is also applicable for a circuit that uses depletion transistors completely, that is, a shift register unit that is constituted by transistors which are all oxide TFTs can be provided, and the normal function of the shift register unit can also be ensured, which has a very high practical value.

It shall be explained that the access control module, the connection control module and the shift register module used in the shift register unit circuit according to the technical concept of this disclosure all have various structures, however, the differences between the different structures thereof are not essential differences between the technical solutions according to the technical concept of this disclosure and other technical solutions. Therefore, in the case of not departing from the spirit and scope of the technical concept according to this disclosure, modifications or equivalent replacements made on the basis of respective exemplary embodiments of this disclosure all belong to the protection scope of this disclosure.

Embodiment 2

Based on the same technical concept, an exemplary embodiment of this disclosure provides a gate driving circuit comprising at least two cascaded shift register units, the shift register units adopting any of the shift register units as stated in Embodiment 1. Specifically, it may apply the shift register unit according to the technical concept of this disclosure in the gate driving circuit to provide a gate driving signal to a pixel unit with multiple cascaded shift register units.

Figure 9:
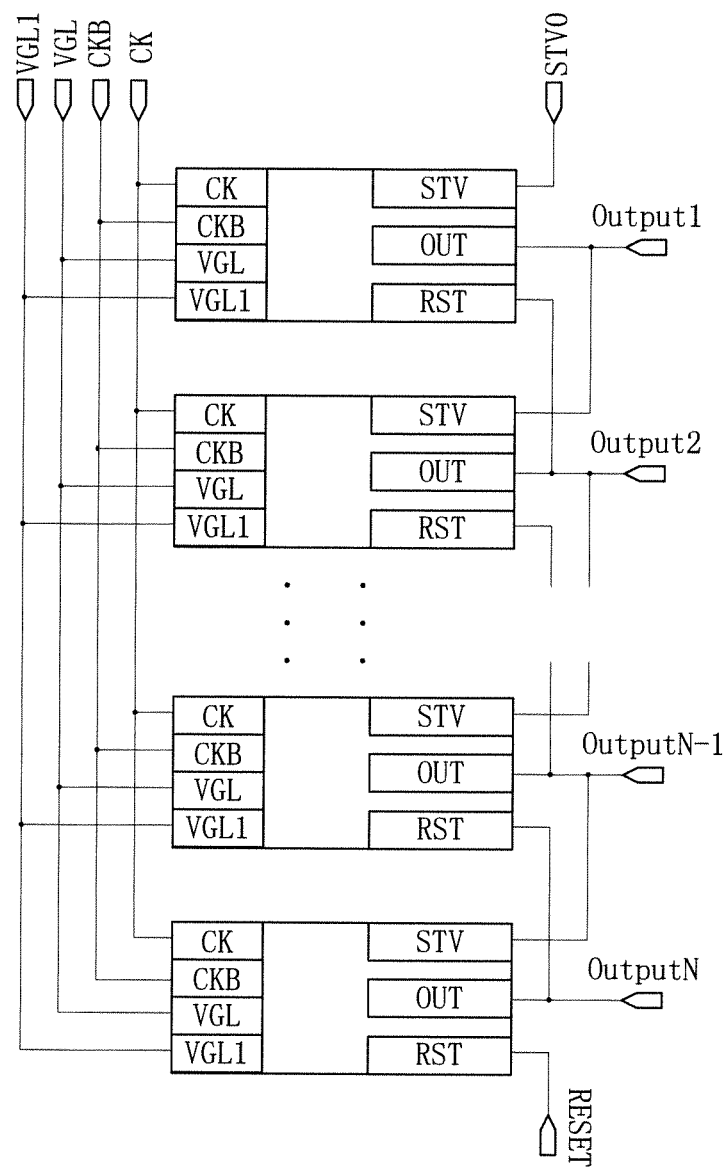
FIG. 9 is a cascade structure diagram of a gate driving circuit according to an exemplary embodiment of the present invention.

The gate driving circuit constituted by any of the shift register units as stated in Embodiment 1 is as shown in FIG. 9, wherein the meanings of the letter reference signs are consistent with those stated in the above embodiment, "OUT" refers to the output end of the shift register unit, Output1, Output2, . . . , OutputN correspond to N gate outputs. In addition, "STV0" represents an input signal, RESRT represents a reset signal.

Since the gate driving circuit provided by an exemplary embodiment of this disclosure has the same technical features as any of the shift register units provided by Embodiment 1, it can also solve the same technical problem and achieve the same technical effect.

Embodiment 3

Based on the same technical concept, an exemplary embodiment of this disclosure proposes a display panel comprising any of the gate driving circuits as stated in Embodiment 2. The display panel may be any product or component with the display function such as a liquid crystal panel, an electronic paper, an OLED panel, a mobile phone, a tablet computer, a television, a display, a laptop, a digital photo frame, a navigator etc.

Since the display panel provided by an exemplary embodiment of this disclosure has the same technical features as any of the gate driving circuit provided by Embodiment 2, it can also solve the same technical problem and achieve the same technical effect.

To sum up, by arranging a connection control module between the access control module and the shift register module, the technical solution according to the technical concept of this disclosure blocks the connection between the access control module and the shift register module when the shift register module performs outputting. Thus, the leakage path from the high potential point in the shift register module to the low potential point in the access control module is blocked, which can reduce the leakage current that passes through the access control module effectively, and ensure normal output of the shift register unit.

Moreover, this disclosure is also applicable for a circuit that uses depletion transistors completely, that is, a shift register unit that is constituted by transistors which are all oxide TFTs can be provided, and the normal function of the shift register unit can also be ensured, which has a very high practical value.

It shall be explained that in this disclosure, the relation terms such as first and second and so on are only used for distinguishing one entity or operation from another entity or operation, while not always requiring or implying that there is any such actual relation or order between these entities or operations. Moreover, the terms of "include", "comprise" or any other variants thereof intend to cover non exclusive inclusion, thereby enabling a process, a method, an article or a device comprising a series of elements not only to comprise those elements but also further comprise other elements that are not listed explicitly, or further comprise inherent elements of the process, the method, the article or the device. In the case of without further limitations, the element defined by the wording "comprising a . . . " does not exclude presence of another same element in the process, the method, the article or the device that comprises the element.

The above embodiments are only used for explanation of the technical solution of this disclosure rather than limitation to it. Although this disclosure has been explained in detail with reference to the preceding embodiments, the ordinary skilled person in the art should understand that: he may still make modifications to the technical solutions stated in the preceding embodiments or make equivalent replacements to part of the technical features therein; and these modifications or replacements will not make the essence of the corresponding technical solution depart from the spirit and scope of the respective exemplary embodiments of this disclosure.

The invention claimed is:

1. A shift register unit comprising:
an access control module for controlling access of an input signal and a reset signal, the access control module comprising a depletion field effect transistor;
a shift register module for outputting the accessed input signal or reset signal under the driving of a clock signal;
the shift register unit further comprising: a connection control module arranged between the access control module and the shift register module for blocking the connection between the access control module and the shift register module when the shift register module performs outputting,
wherein the connection control module comprises a sixth switch element, a seventh switch element, an eighth switch element and a third capacitor;
a second end of the sixth switch element is connected with a first end of the eighth switch element and a first end of the third capacitor;
a second end of the seventh switch element is connected with a second end of the third capacitor;
a first end of the sixth switch element is connected with the shift register module, a second end of the eighth switch element is connected with the access control module;
the clock signal comprises a first clock signal and a second clock signal, the first clock signal is connected to a control end of the seventh switch element, the second clock signal is connected to control ends of the sixth switch element and the eighth switch element;
a first end of the seventh switch element is connected with the low level working voltage line.

2. The shift register unit according to claim 1, wherein the shift register module comprises a first switch element, a second switch element and a first capacitor;
a first end of the first switch element is connected with a second end of the second switch element and a second end of the first capacitor, and is connected with an output end of the shift register unit;
a control end of the first switch element is connected with a first end of the first capacitor, and is connected with the connection control module;
the first clock signal is connected to a second end of the first switch element, the second clock signal is connected to a control end of the second switch element;
a first end of the second switch element is connected with the low level working voltage line.

3. The shift register unit according to claim 2, wherein the shift register module further comprises a third switch element, a fourth switch element, a fifth switch element and a second capacitor;
a second end of the third switch element is connected with the output end of the shift register unit;
a control end of the third switch element is connected with a second end of the second capacitor, a second end of the fourth switch element, and a control end of the fifth switch element;
a second end of the fifth switch element is connected with a control end of the fourth switch element, and is connected with the control end of the first switch element;
the first clock signal is further connected to a first end of the second capacitor;
first ends of the third, fourth, and fifth switch elements are connected with the low level working voltage line.

4. The shift register unit according to claim 3, wherein the switch elements of the shift register module are all depletion thin film transistors.

5. The shift register unit according to claim 3, wherein the first end of the fourth switch element is changed to be connected to a bias voltage line whose voltage value is lower than the low level working voltage.

6. The shift register unit according to claim 1, wherein the switch elements are thin film transistors.

7. The shift register unit according to claim 6, wherein the thin film transistors are oxide thin film transistors.

8. The shift register unit according to claim 1, wherein the access control module comprises a ninth switch element, a tenth switch element, an eleventh switch element and a twelfth switch element;
a second end of the ninth switch element is connected with a first end of the tenth switch element, and control ends of the ninth switch element and the tenth switch element are connected with a reset end of the shift register unit;

a second end of the tenth switch element is connected with a first end of the eleventh switch element, and is connected with the connection control module;

a second end of the eleventh switch element is connected with a first end of the twelfth switch element, and the twelfth switch element is connected with an input end of the shift register unit;

the second clock signal is connected to control ends of the eleventh switch element and the twelfth switch element;

a first end of the ninth switch element is connected with the low level working voltage line.

9. The shift register unit according to claim 8, wherein the switch elements are thin film transistors.

10. The shift register unit according to claim 9, wherein the thin film transistors are oxide thin film transistors.

11. A gate driving circuit comprising at least two cascaded shift register units, wherein the shift register unit comprises:
   an access control module for controlling access of an input signal and a reset signal, the access control module comprising a depletion field effect transistor;
   a shift register module for outputting the accessed input signal or reset signal under the driving of a clock signal;
   the shift register unit further comprises: a connection control module arranged between the access control module and the shift register module for blocking the connection between the access control module and the shift register module when the shift register module performs outputting,
   wherein the connection control module comprises a sixth switch element, a seventh switch element, an eighth switch element and a third capacitor;
   a second end of the sixth switch element is connected with a first end of the eighth switch element and a first end of the third capacitor;
   a second end of the seventh switch element is connected with a second end of the third capacitor;
   a first end of the sixth switch element is connected with the shift register module, a second end of the eighth switch element is connected with the access control module;
   the clock signal comprises a first clock signal and a second clock signal, the first clock signal is connected to a control end of the seventh switch element, the second clock signal is connected to control ends of the sixth switch element and the eighth switch element;
   a first end of the seventh switch element is connected with the low level working voltage line.

12. The gate driving circuit according to claim 11, wherein the shift register module comprises a first switch element, a second switch element and a first capacitor;
   a first end of the first switch element is connected with a second end of the second switch element and a second end of the first capacitor, and is connected with an output end of the shift register unit;
   a control end of the first switch element is connected with a first end of the first capacitor, and is connected with the connection control module;
   the first clock signal is connected to a second end of the first switch element, the second clock signal is connected to a control end of the second switch element;
   a first end of the second switch element is connected with the low level working voltage line.

13. The gate driving circuit according to claim 12, wherein the shift register module further comprises a third switch element, a fourth switch element, a fifth switch element and a second capacitor;
   a second end of the third switch element is connected with the output end of the shift register unit;
   a control end of the third switch element is connected with a second end of the second capacitor, a second end of the fourth switch element, and a control end of the fifth switch element;
   a second end of the fifth switch element is connected with a control end of the fourth switch element, and is connected with the control end of the first switch element;
   the first clock signal is further connected to a first end of the second capacitor;
   first ends of the third, fourth, and fifth switch elements are connected with the low level working voltage line.

14. The gate driving circuit according to claim 13, wherein the switch elements of the shift register module are all depletion thin film transistors.

15. The gate driving circuit according to claim 11, wherein the switch elements are thin film transistors.

16. The gate driving circuit according to claim 11, wherein the access control module comprises a ninth switch element, a tenth switch element, an eleventh switch element and a twelfth switch element;
   a second end of the ninth switch element is connected with a first end of the tenth switch element, and control ends of the ninth switch element and the tenth switch element are connected with a reset end of the shift register unit;
   a second end of the tenth switch element is connected with a first end of the eleventh switch element, and is connected with the connection control module;
   a second end of the eleventh switch element is connected with a first end of the twelfth switch element, and a second end of the twelfth switch element is connected with an input end of the shift register unit;
   the second clock signal is connected to control ends of the eleventh switch element and the twelfth switch element;
   a first end of the ninth switch element is connected with the low level working voltage line.

17. The gate driving circuit according to claim 16, wherein the switch elements are thin film transistors.

18. A display panel, characterized in that the display panel comprises a gate driving circuit according to claim 11.

* * * * *